United States Patent
Banba et al.

(10) Patent No.: US 10,418,165 B2
(45) Date of Patent: Sep. 17, 2019

(54) ELECTRONIC DEVICE

(71) Applicant: Murata Manufacturing Co., Ltd., Kyoto (JP)

(72) Inventors: Shinichiro Banba, Kyoto (JP); Masaaki Mizushiro, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 432 days.

(21) Appl. No.: 15/232,978

(22) Filed: Aug. 10, 2016

(65) Prior Publication Data

US 2016/0351322 A1    Dec. 1, 2016

Related U.S. Application Data

(63) Continuation of application No. PCT/JP2015/053216, filed on Feb. 5, 2015.

(30) Foreign Application Priority Data

Feb. 24, 2014 (JP) ................... 2014-032533

(51) Int. Cl.
*H01F 5/00* (2006.01)
*H01F 27/28* (2006.01)
(Continued)

(52) U.S. Cl.
CPC ..... *H01F 27/2804* (2013.01); *H01F 17/0006* (2013.01); *H01F 17/0013* (2013.01);
(Continued)

(58) Field of Classification Search
USPC ................................ 336/200, 223
See application file for complete search history.

(56) References Cited

U.S. PATENT DOCUMENTS 7,253,711 B2 * 8/2007 Pleskach ............. H01F 17/0033
  257/E23.062
2009/0002111 A1 * 1/2009 Harrison ................. H01F 19/04
  336/69

(Continued)

FOREIGN PATENT DOCUMENTS

CN          102870210 A     1/2013
EP          2370981 B1     10/2012
(Continued)

OTHER PUBLICATIONS

Office action issued in JP2016-504028 dated Sep. 5, 2017.
(Continued)

*Primary Examiner* — Elvin G Enad
*Assistant Examiner* — Kazi S Hossain
(74) *Attorney, Agent, or Firm* — Pearne & Gordon LLP

(57) ABSTRACT

An electronic device includes an insulating layer, a plurality of upper wiring electrode patterns formed on an upper surface of the insulating layer, and a plurality of lower wiring electrode patterns formed on a lower surface of the insulating layer. The upper wiring electrode patterns and the lower wiring electrode patterns each include an underlying electrode layer formed of a conductive paste and a plating electrode layer formed on the underlying electrode layer. With this configuration, the resistivity of the upper and lower wiring electrode patterns and can be made lower than that of the upper and lower wiring electrode patterns and each including only the underlying electrode layer formed of a conductive paste.

19 Claims, 6 Drawing Sheets

(51) Int. Cl.
 H01F 17/04 (2006.01)
 H05K 1/16 (2006.01)
 H05K 3/24 (2006.01)
 H01F 17/00 (2006.01)
 H01F 17/06 (2006.01)
 H01F 27/32 (2006.01)

(52) U.S. Cl.
 CPC ............ *H01F 17/04* (2013.01); *H05K 1/165* (2013.01); *H05K 3/246* (2013.01); *H01F 17/0033* (2013.01); *H01F 17/06* (2013.01); *H01F 27/32* (2013.01); *H05K 2201/0347* (2013.01); *H05K 2201/086* (2013.01); *H05K 2201/0979* (2013.01); *H05K 2201/10363* (2013.01); *H05K 2203/049* (2013.01)

(56) References Cited

U.S. PATENT DOCUMENTS

| | | | | |
|---|---|---|---|---|
| 2009/0273428 | A1* | 11/2009 | Chen | H01F 17/0033 336/200 |
| 2011/0186336 | A1* | 8/2011 | Nakayama | B24C 3/322 174/255 |
| 2014/0301054 | A1* | 10/2014 | Nagai | H01L 33/62 361/761 |

FOREIGN PATENT DOCUMENTS

| | | |
|---|---|---|
| JP | S47-32249 A | 8/1972 |
| JP | S6229115 A | 2/1987 |
| JP | H05267818 A | 10/1993 |
| JP | 2000303186 A | 10/2000 |
| JP | 2002367830 A | 12/2002 |
| JP | 2006303368 A | 11/2006 |
| JP | 2010516056 A | 5/2010 |
| JP | 2012-510725 A | 5/2012 |
| JP | 2013207149 A | 10/2013 |
| WO | 2008/088682 A2 | 7/2008 |
| WO | 2011/138949 A1 | 11/2011 |

OTHER PUBLICATIONS

International Search Report for PCT/JP2015/053216 dated Apr. 21, 2015.
Written Opinion for PCT/JP2015/053216 dated Apr. 21, 2015.
Chinese Office Action for 201580010027.1 dated Apr. 3, 2018.

\* cited by examiner

ELECTRONIC DEVICE

This application is a continuation of International Application No. PCT/JP2015/053216 filed on Feb. 5, 2015 which claims priority from Japanese Patent Application No. 2014-032533 filed on Feb. 24, 2014. The contents of these applications are incorporated herein by reference in their entireties.

BACKGROUND

Technical Field

The present disclosure relates to an electronic device that includes a wiring electrode pattern formed on an insulating layer and a metal pin connected to the wiring electrode pattern.

In an electronic device using high-frequency signals, a toroidal coil may be mounted on a wiring board as a component for noise prevention. The toroidal coil is larger in size than other electronic components mounted on the wiring board, and hence takes up a large mounting area in the wiring board. Mounting such a large toroidal coil on the wiring board may make it difficult to lower the profile of the entire electronic device.

Conventionally, a technique in which a toroidal coil is embedded in a wiring board has been proposed to reduce the size of the electronic device. For example, as illustrated in FIG. 9, an electronic device 100 described in Patent Document 1 includes a wiring board 101 formed by stacking a plurality of insulating layers, an annular magnetic core 102 embedded in the wiring board 101, and a coil pattern 103 disposed in and on the wiring board 101 and helically wound around the magnetic core 102.

The coil pattern 103 includes a plurality of upper wiring electrode patterns 103a formed on the upper side of the coil pattern 103, a plurality of lower wiring electrode patterns 103b formed on the lower side of the coil pattern 103, and a plurality of interlayer connection conductors 104 each connecting a predetermined one of the upper wiring electrode pattern 103a to the corresponding lower wiring electrode pattern 103b. The upper wiring electrode patterns 103a and the lower wiring electrode patterns 103b are formed, for example, by etching of Cu foil. The interlayer connection conductors 104 are formed by plating via holes formed in the insulating layers. Since the magnetic core 102 and the coil pattern 103 are thus embedded in the wiring board 101, it is possible not only to secure an area for mounting components on the wiring board 101 and reduce the principal surface area of the wiring board, but also to lower the profile of the entire electronic device 100.

Patent Document 1: Japanese Unexamined Patent Application Publication No. 2013-207149 (see, e.g., paragraphs [0015] to [0021], FIG. 1)

BRIEF SUMMARY

The upper and lower wiring electrode patterns 103a and 103b of the conventional electronic device 100 may be formed of a conductive paste for the purposes of, for example, reducing the cost of forming the wiring electrode patterns 103a and 103b and improving the strength of adhesion to the insulating layers.

A typical conductive paste is made by mixing a filler metal, such as Cu or Ag, into a resin solvent, and thus the wiring electrode patterns 103a and 103b conduct electricity by point contact of filler metal particles therein. Therefore, the resistivity of the wiring electrode patterns 103a and 103b formed of a conductive paste is higher than that of the wiring electrode patterns 103a and 103b formed by etching of metal foil. When the wiring electrode patterns 103a and 103b are formed of a conductive paste, the connection resistance with the interlayer connection conductors 104 also increases.

The present disclosure has been made in view of the problems described above. The present disclosure lowers the resistivity of a wiring electrode pattern formed on an insulating layer. The present disclosure reduces connection resistance between the wiring electrode pattern and a columnar conductor connected thereto.

An electronic device according to the present disclosure includes an insulating layer, and a wiring electrode pattern formed on the insulating layer. The wiring electrode pattern includes an underlying electrode layer formed of a conductive paste and a plating electrode layer formed on the underlying electrode layer.

In the wiring electrode pattern of the present disclosure, the plating electrode layer is formed on the underlying electrode layer. In this case, since bonding between metal atoms forming the plating electrode layer is metallic bonding, the resistivity of the wiring electrode pattern can be made lower than that of the wiring electrode pattern including only the underlying electrode layer formed of a conductive paste. Also, using higher frequencies facilitates the flow of current over the surface of the wiring electrode pattern, and thus can lower the resistivity of the wiring electrode pattern.

Also, since the underlying electrode layer is formed of a conductive paste, the strength of adhesion between the wiring electrode pattern and the insulating layer is higher than that in the case where, for example, the wiring electrode pattern is formed by etching of metal foil.

Since a filler metal in the underlying electrode layer can serve as a plating core for the plating electrode layer, the wiring electrode pattern including the plating electrode layer can be easily formed on the insulating layer.

The electronic device according to the present disclosure may further include a columnar conductor disposed in the insulating layer and connected at a first end face thereof to the wiring electrode pattern. The underlying electrode layer of the wiring electrode pattern may be formed to cover, with an end portion thereof, a part of the first end face of the columnar conductor, and the remaining part of the first end face not covered by the underlying electrode layer may be covered by the plating electrode layer. With this configuration, the first end face of the columnar conductor has a region directly connected to the plating electrode layer with lower resistivity than the underlying electrode layer. It is thus possible not only to lower the resistivity of the wiring electrode pattern, but also reduce the connection resistance between the wiring electrode pattern and the columnar conductor.

The wiring electrode pattern may be linear in shape, and a width of the end portion of the underlying electrode layer covering the first end face of the columnar conductor may be smaller than a width of the first end face of the columnar conductor. This can provide a specific configuration in which the underlying electrode layer covers a part of the first end face of the columnar conductor connected to the wiring electrode pattern.

The electronic device may further include an annular coil core embedded in the insulating layer, and a coil electrode disposed in and on the insulating layer to be wound around the coil core. In the coil electrode, a plurality of metal pins each serving as the columnar conductor may be arranged side by side on each of inner and outer sides of the coil core such that the metal pins are in pairs on the inner and outer sides, and the first end faces of metal pins in each pair on the inner and outer sides of the coil core may be connected to each other by one of a plurality of wiring electrode patterns; and a second end face of each of the metal pins on the outer side may be connected by a connecting portion to a second end face of a corresponding one of the metal pins on the inner side, the corresponding one being adjacent on a predetermined side to one of the metal pins on the inner side, the one being paired with the metal pin on the outer side.

In this case, a toroidal coil including the annular coil core and the coil electrode helically wound around the coil core is embedded in the insulating layer of the electronic device. Since the coil electrode includes a plurality of metal pins and a plurality of wiring electrode patterns, it is possible not only to lower the resistivity of the wiring electrode pattern portion of the coil electrode, but also reduce the connection resistance between the wiring electrode patterns and the metal pins. Since this can lower the overall resistivity of the coil electrode, it is possible to provide an electronic device including a toroidal coil having excellent coil characteristics.

In an electronic device including a coil embedded in an insulating layer, when via holes are provided to form columnar conductors as part of a coil electrode, the extent to which the pitch between the columnar conductors can be narrowed is limited. When metal pins are used as the columnar conductors as in the present disclosure, the pitch between the metal pins can be made narrower than in the case of the columnar conductors formed in the via holes. Thus, since the number of turns in the coil electrode can be increased easily, it is possible to easily form a toroidal coil having a high inductance.

The electronic device may further include a coil core embedded in the insulating layer, and a coil electrode disposed in and on the insulating layer to be wound around the coil core. In the coil electrode, a plurality of metal pins each serving as the columnar conductor may be arranged side by side on each of first and second sides of the coil core such that the metal pins are in pairs on the first and second sides, and the first end faces of metal pins in each pair on the first and second sides of the coil core may be connected to each other by one of a plurality of wiring electrode patterns; and a second end face of each of the metal pins on the first side may be connected by a connecting portion to a second end face of a corresponding one of the metal pins on the second side, the corresponding one being adjacent on a predetermined side to one of the metal pins on the second side, the one being paired with the metal pin on the first side.

In this case, a coil including, for example, a bar-like coil core and a coil electrode helically wound around the coil core is embedded in the insulating layer of the electronic device. Since the coil electrode includes a plurality of metal pins and a plurality of wiring electrode patterns, it is possible not only to lower the resistivity of the wiring electrode pattern portion of the coil electrode, but also reduce the connection resistance between the wiring electrode patterns and the metal pins. Since this can lower the overall resistivity of the coil electrode, it is possible to provide an electronic device including a coil having excellent coil characteristics.

The metal pins, each serving as the columnar conductor, are used as part of the coil electrode. Therefore, as in the case of the electronic device including the annular magnetic core described above, the pitch between metal pins can be made narrower than in the columnar conductors formed in the via holes. Thus, since the number of turns in the coil electrode can be increased easily, it is possible to easily form a coil having a high inductance.

The wiring electrode pattern may be formed on a principal surface of the insulating layer, the insulating layer may have a recessed portion provided in a region of the principal surface where the wiring electrode pattern is formed, and the wiring electrode pattern may be formed to fill in the recessed portion. With this configuration, it is possible to increase the thickness of the wiring electrode pattern to further lower the resistivity of the wiring electrode pattern while maintaining the thickness of the electronic device.

A cross-sectional area of each of the metal pins on the outer side may be greater than a cross-sectional area of each of the metal pins on the inner side. To produce a coil having a high inductance, it is necessary to increase the number of turns in the coil. In this case, in the annular coil core, the diameter (cross-sectional area) of each of the metal pins on the inner side where space is limited needs to be reduced. However, reducing the diameter of the metal pin increases the resistance value of the metal pin, and may lead to degradation of coil characteristics. Accordingly, in addition to reducing the cross-sectional area of each metal pin on the inner side to make it easier to increase the number of turns in the coil electrode, the cross-sectional area of each metal pin on the outer side is increased. This can reduce an increase in the overall resistance of the coil electrode.

A bonding wire may serve as the connecting portion. Since the loop height of the bonding wire can be changed easily, it is easy to avoid contact between bonding wires. Therefore, in the coil electrode with many turns, the bonding wire can be suitably used as the connecting portion for connection between predetermined ones of the metal pins.

A plurality of bonding wires may serve as the connecting portion. In this case, since corresponding metal pins are connected to each other by a plurality of bonding wires, the connection resistance between these metal pins can be reduced.

The wiring electrode pattern may be a shielding ground electrode pattern. In this case, the resistivity of the shielding ground electrode pattern can be reduced, and thus the shielding characteristics can be improved.

The insulating layer may be formed of resin. This can provide a specific configuration in which the insulating layer is formed of resin.

In the present disclosure, the wiring electrode pattern includes the underlying electrode layer and the plating electrode layer formed on the underlying electrode layer. In this case, since bonding between metal atoms forming the plating electrode layer is metallic bonding, the resistivity of the wiring electrode pattern can be made lower than that of the wiring electrode pattern including only the underlying electrode layer formed of a conductive paste. Also, using higher frequencies facilitates the flow of current over the surface of the wiring electrode pattern, and thus can lower the resistivity of the wiring electrode pattern.

Also, since the underlying electrode layer is formed of a conductive paste, the strength of adhesion between the wiring electrode pattern and the insulating layer is higher than that in the case where, for example, the wiring electrode pattern is formed by etching of metal foil.

Since a filler metal in the underlying electrode layer can serve as a plating core for the plating electrode layer, the wiring electrode pattern including the plating electrode layer can be easily formed on the insulating layer.

DETAILED DESCRIPTION

First Embodiment

Figure 1:
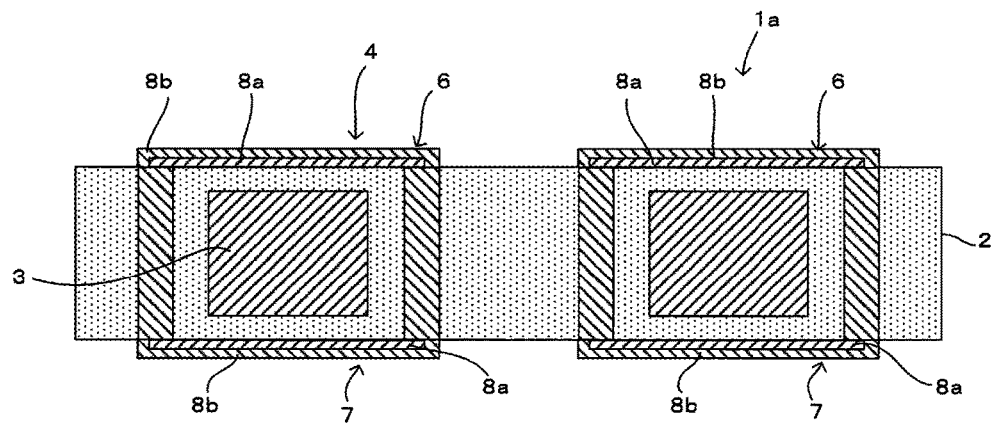
FIG. 1 is a cross-sectional view of an electronic device according to a first embodiment of the present disclosure.
Figure 2:
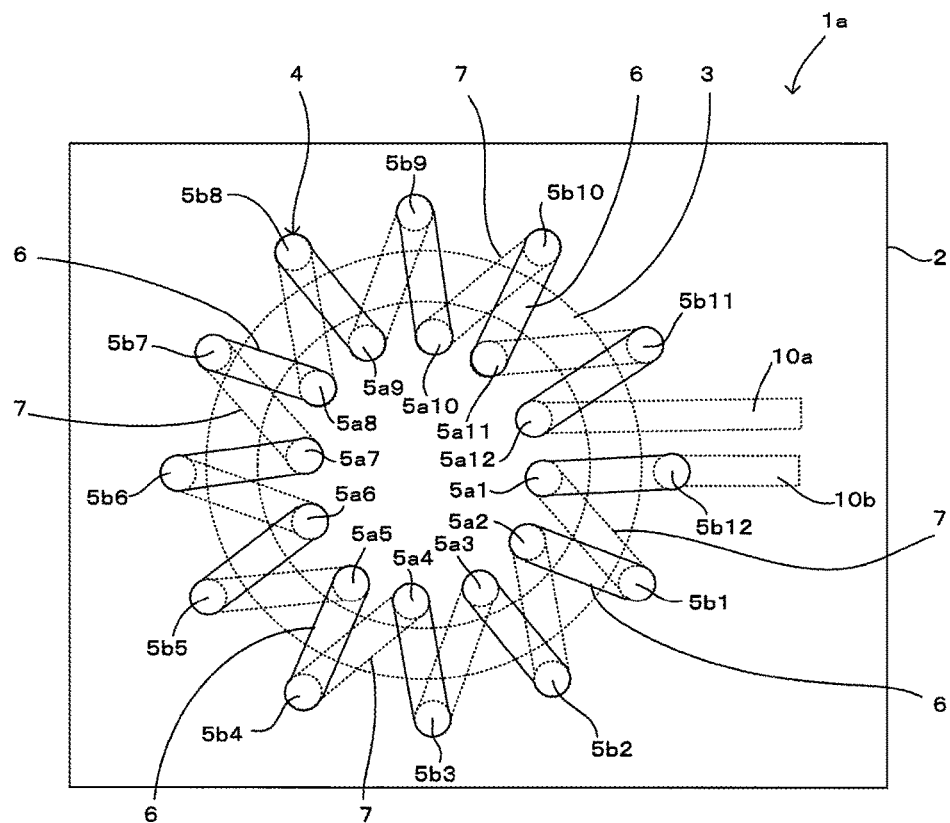
FIG. 2 is a plan view of the electronic device illustrated in FIG. 1.
Figure 3A:
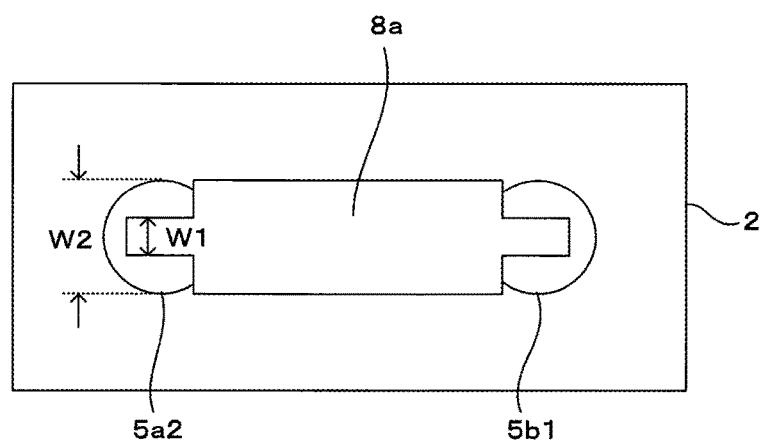
FIGS. 3A and 3B are plan views of a wiring electrode pattern illustrated in FIG. 1.
Figure 3B:
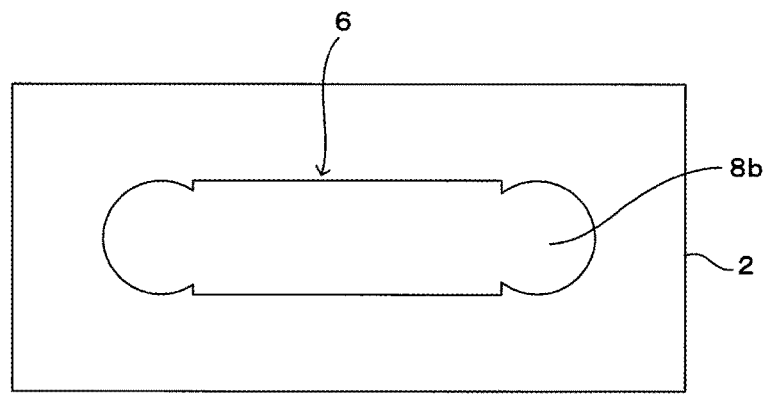

An electronic device $1a$ according to a first embodiment of the present disclosure will now be described with reference to FIGS. 1 to 3. FIG. 1 is a cross-sectional view of the electronic device $1a$, FIG. 2 is a plan view of the electronic device $1a$, and FIGS. 3A and 3B are plan views of an upper wiring electrode pattern. Specifically, FIG. 3A illustrates only an underlying electrode layer $8a$ of an upper wiring electrode pattern $6$, and FIG. 3B illustrates the upper wiring electrode pattern $6$ with a plating electrode layer $8b$ added.

As illustrated in FIG. 1, the electronic device $1a$ according to the present embodiment includes an insulating layer $2$, an annular magnetic core $3$ (corresponding to "coil core" of the present disclosure) embedded in the insulating layer $2$, and a coil pattern $4$ (corresponding to "coil electrode" of the present disclosure) disposed in and on the insulating layer $2$ to be wound around the magnetic core $3$.

The insulating layer $2$ is formed of an insulating material, such as low temperature co-fired ceramic or glass epoxy resin. The insulating layer $2$ may have either a monolithic structure or a multilayer structure.

The magnetic core $3$ has an annular shape and is formed of a magnetic material, such as ferrite or iron, generally used as a material for making coil cores.

The coil pattern $4$ is helically wound along and around the magnetic core $3$. The coil pattern $4$ includes a plurality of metal pins $5a1$ to $5a12$ and metal pins $5b1$ to $5b12$ (corresponding to "columnar conductor" of the present disclosure) standing on inner and outer sides of the magnetic core $3$, a plurality of linear upper wiring electrode patterns $6$ formed on an upper surface of the insulating layer $2$ and each connecting the upper end face of one of the metal pins $5a1$ to $5a12$ on the inner side to the upper end face of the corresponding one of the metal pins $5b1$ to $5b12$ on the outer side, a plurality of linear lower wiring electrode patterns $7$ formed on a lower surface of the insulating layer $2$ and each connecting the lower end face of one of the metal pins $5a1$ to $5a12$ on the inner side to the lower end face of the corresponding one of the metal pins $5b1$ to $5b12$ on the outer side, and extended wires $10a$ and $10b$ formed on the lower surface of the insulating layer $2$.

Specifically, as illustrated in FIG. 2, the metal pins $5a1$ to $5a12$ and $5b1$ to $5b12$ are arranged side by side on the inner and outer sides of the magnetic core $3$ such that they are in pairs on the inner and outer sides of the magnetic core $3$. That is, in the present embodiment, the metal pins $5a1$ to $5a12$ on the inner side are arranged side by side at predetermined intervals in the vicinity of the inner periphery of the magnetic core $3$, whereas the metal pins $5b1$ to $5b12$ on the outer side are arranged side by side at predetermined intervals in the vicinity of the outer periphery of the magnetic core $3$. The metal pins on the inner and outer sides are in pairs, such as ($5a1$, $5b1$), ($5a2$, $5b2$), and ($5a3$, $5b3$).

The lower end faces (corresponding to "first end face" of the present disclosure) of corresponding ones of the metal pins $5a1$ to $5a12$ and $5b1$ to $5b12$ in each pair on the inner and outer sides of the magnetic core $3$ are connected to each other by one of the lower wiring electrode patterns $7$. At the same time, the upper end face (corresponding to "second end face" of the present disclosure) of each of the metal pins $5b1$ to $5b12$ on the outer side is connected, by one of the upper wiring electrode patterns $6$ (corresponding to "connecting portion" of the present disclosure), to the upper end face of a corresponding one of the metal pins $5a1$ to $5a12$ on the inner side, the corresponding one being adjacent on a predetermined side to one of the metal pins $5a1$ to $5a12$ on the inner side, the one being paired with the metal pin on the outer side.

More specifically, the lower end faces of the metal pin $5a1$ on the inner side and the metal pin $5b1$ on the outer side, which are in a pair, are connected to each other by one of the lower wiring electrode patterns $7$, whereas the upper end face of the metal pin $5b1$ on the outer side and the upper end face of the metal pin $5a2$ on the inner side are connected to each other by one of the upper wiring electrode patterns $6$. The metal pin $5a2$ is adjacent on a predetermined side (in a clockwise direction in the present embodiment) to the metal pin $5a1$ that is paired with the metal pin $5b1$. Similarly, the lower end faces of the metal pin $5a2$ on the inner side and the metal pin $5b2$ on the outer side, which are in a pair, are connected to each other by another of the lower wiring electrode patterns $7$. The other metal pins $5a3$ to $5a12$ and $5b3$ to $5b12$ are connected in the same manner as above. With this connection configuration, the coil pattern $4$ is helically wound around the magnetic core $3$.

The metal pins $5a1$ to $5a12$ and $5b1$ to $5b12$ are formed, for example, by shearing a wire rod formed of metal containing Cu and Ni. To produce a coil having a high inductance, it is necessary to increase the number of turns in the coil. In this case, the cross-sectional area of each of the metal pins $5a1$ to $5a12$ on the inner side of the annular magnetic core $3$ where space is limited needs to be reduced. However, reducing the cross-sectional area of each of the metal pins $5a1$ to $5a12$ on the inner side increases the resistance value of the metal pins $5a1$ to $5a12$, and may lead to degradation of coil characteristics. Accordingly, in addition to reducing the cross-sectional area of each of the metal pins $5a1$ to $5a12$ on the inner side, the cross-sectional area of each of the metal pins $5b1$ to $5b12$ on the outer side may be made greater than that of each of the metal pins $5a1$ to $5a12$ on the inner side. Thus, reducing the cross-sectional area of each of the metal pins $5a1$ to $5a12$ on the inner side makes it easier to increase the number of turns in the coil pattern $4$, and increasing the cross-sectional area of each of the metal pins $5b1$ to $5b12$ on the outer side makes it possible to reduce an increase in the overall resistance of the coil pattern $4$.

The upper wiring electrode patterns $6$ and the lower wiring electrode patterns $7$ each include the underlying electrode layer $8a$ formed on the upper (or lower) surface of the insulating layer 2, and the plating electrode layer 8b formed on the underlying electrode layer 8a. As an example, FIGS. 3A and 3B illustrate the upper wiring electrode pattern 6 that connects the metal pin 5b1 on the outer side to the metal pin 5a2 on the inner side. As illustrated, a width W1 of each end portion of the underlying electrode layer 8a is smaller than a width W2 of the upper end face of each of the metal pins 5a2 and 5b1 (W1<W2). In other words, the underlying electrode layer 8a is formed such that each of its end portions covers a part of the upper end face of the corresponding one of the metal pins 5a2 and 5b1. The underlying electrode layer 8a is formed on a principal surface of the insulating layer 2 by screen printing using a conductive paste made by mixing a filler metal (filler Cu in the present embodiment) into an organic solvent.

As illustrated in FIG. 3B, the plating electrode layer 8b is formed by plating the underlying electrode layer 8a and the remaining part of the upper end face of each of the metal pins 5a2 and 5b1 on the inner and outer sides not covered by the underlying electrode layer 8a. This means that the upper end faces of the metal pins 5a2 and 5b1 connected to the upper wiring electrode pattern 6 each have a region directly connected to the plating electrode layer 8b. In the present embodiment, the plating electrode layer 8b is formed by Cu plating using the metal in the metal pins 5a2 and 5b1 and the filler metal in the underlying electrode layer 8a as a plating core.

In the foregoing description, the relationship between the widths W1 and W2 is defined on the basis of the configuration where each end portion of the underlying electrode layer 8a covers a part of the upper end face of the corresponding one of the metal pins 5a2 and 5b1. The shape of the underlying electrode layer 8a may be appropriately changed, as long as the underlying electrode layer 8a is formed to cover a part of the upper end face of each of the metal pins 5a2 and 5b1.

In the embodiment described above, the upper wiring electrode patterns 6 and the lower wiring electrode patterns 7 are each obtained by forming the plating electrode layer 8b on the underlying electrode layer 8a. The underlying electrode layer 8a formed of a conductive paste conducts electricity by point contact of filler metal particles therein. On the other hand, conventional wiring electrode patterns formed by etching of metal foil and the plating electrode layer 8b conduct electricity by metallic bonding between metal atoms therein. Therefore, if the wiring electrode patterns 6 and 7 are each formed only by the underlying electrode layer 8a (conductive paste), the resistivity of the wiring electrode patterns 6 and 7 is higher than that of the conventional wiring electrode patterns formed by etching of metal foil. However, in each of the wiring electrode patterns 6 and 7 of the present embodiment, the plating electrode layer 8b having metallic bonding is formed on the underlying electrode layer 8a formed of a conductive paste. This can lower the overall resistivity of the wiring electrode patterns 6 and 7. Also, using higher frequencies facilitates the flow of current over the surface of the wiring electrode patterns 6 and 7, and thus can lower the resistivity of the wiring electrode patterns 6 and 7.

The plating electrode layer 8b may be formed by applying electroless plating onto the underlying electrode layer 8a and then applying electrolytic plating onto it, so that the wiring electrode patterns 6 and 7 each have a three-layer structure of the underlying electrode layer 8a, the electroless plating layer, and the electrolytic plating layer. With this configuration, it is possible to increase the thickness of each of the wiring electrode patterns 6 and 7 and further reduce the resistance value. It is also possible to form a stable electrolytic plating film.

Since the underlying electrode layer 8a is formed of a conductive paste, the strength of adhesion between the wiring electrode patterns 6 and 7 and the insulating layer 2 is higher than that in the case where, for example, the wiring electrode patterns are formed by etching of metal foil.

Since the filler metal in the underlying electrode layer 8a can serve as a plating core for the plating electrode layer 8b, the wiring electrode patterns 6 and 7 each including the plating electrode layer 8b can be easily formed on the insulating layer 2.

As described above, each end portion of the underlying electrode layer 8a of each of the wiring electrode patterns 6 and 7 is formed to cover a part of the corresponding end face of the corresponding one of the metal pins 5a1 to 5a12 and 5b1 to 5b12, and the remaining part of the end face not covered by the underlying electrode layer 8a is covered by the plating electrode layer 8b. With this configuration, each end face of each of the metal pins 5a1 to 5a12 and 5b1 to 5b12 connected to the wiring electrode patterns 6 and 7 has a region directly connected to the plating electrode layer 8b with lower resistivity than the underlying electrode layer 8a. It is thus possible not only to lower the resistivity of the wiring electrode patterns 6 and 7, but also reduce the connection resistance between the wiring electrode patterns 6 and 7 and the metal pins 5a1 to 5a12 and 5b1 to 5b12. Since this can lower the overall resistivity of the coil pattern 4, it is possible to provide the electronic device 1a including a toroidal coil having excellent coil characteristics.

In an electronic device including a coil embedded in an insulating layer, when via holes are provided to form columnar conductors as part of a coil pattern, the extent to which the pitch between the columnar conductors can be narrowed is limited. As in the electronic device 1a of the present embodiment, when the metal pins 5a1 to 5a12 and 5b1 to 5b12 are used as columnar conductors, the pitch between the metal pins 5a1 to 5a12 and 5b1 to 5b12 can be made narrower than in the case of the columnar conductors formed in the via holes. Thus, since the number of turns in the coil pattern 4 can be increased easily, it is possible to easily form a toroidal coil having a high inductance.

(Modified Coil)

Figure 4:
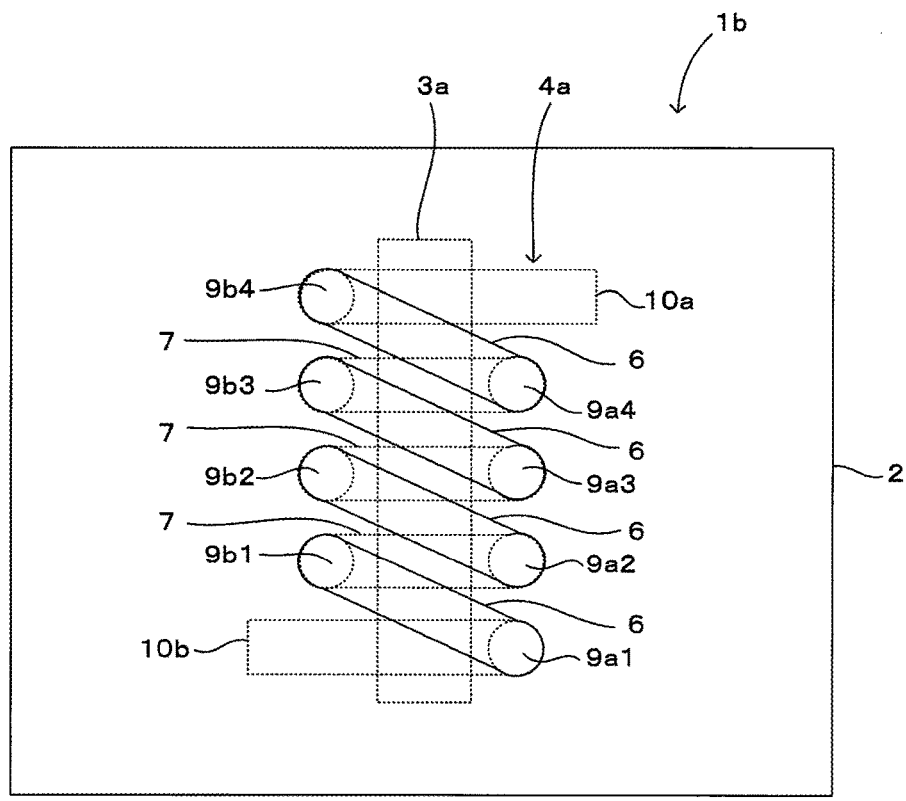
FIG. 4 is a diagram for describing a modified coil.

A coil obtained by modifying the one in the electronic device 1a of the first embodiment will be described with reference to FIG. 4. FIG. 4 is a diagram for describing a modified coil, and corresponds to FIG. 2 of the first embodiment. In FIG. 4, components equivalent or corresponding to those in the electronic device 1a of the first embodiment are denoted by the same reference numerals as in FIG. 2, and thus their description will be omitted.

In the first embodiment described above, the magnetic core 3 is formed in an annular shape. Alternatively, for example, as illustrated in FIG. 4, a magnetic core 3a in an electronic device 1b may be formed in a rectangular shape in plan view. In this case, a coil pattern 4a is helically wound around the magnetic core 3a. The coil pattern 4a includes a plurality of metal pins 9a1 to 9a4 and 9b1 to 9b4 standing on a first side (right side in the drawing) and a second side (left side in the drawing) of the magnetic core 3a, a plurality of linear upper wiring electrode patterns 6 formed on the upper surface of the insulating layer 2 and each connecting the upper end face of one of the metal pins 9a1 to 9a4 on the first side to the upper end face of the corresponding one of the metal pins 9b1 to 9b4 on the second side, a plurality of linear lower wiring electrode patterns 7 formed on the lower surface of the insulating layer 2 and each connecting the lower end face of one of the metal pins 9a1 to 9a4 on the first side to the lower end face of the corresponding one of the metal pins 9b1 to 9b4 on the second side, and the extended wires 10a and 10b formed on the lower surface of the insulating layer 2.

Specifically, as illustrated in FIG. 4, the metal pins 9a1 to 9a4 and 9b1 to 9b4 are arranged side by side on the first and second sides of the magnetic core 3a such that they are in pairs on the first and second sides of the magnetic core 3a. In the present embodiment, the metal pins 9a1 to 9a4 on the first side are arranged side by side at predetermined intervals in the vicinity of the right side of the magnetic core 3a in the drawing, whereas the metal pins 9b1 to 9b4 on the second side are arranged side by side at predetermined intervals in the vicinity of the left side of the magnetic core 3a in the drawing. In the present example, of the metal pins 9a1 to 9a4 and 9b1 to 9b4 on the first and second sides, the metal pin 9a2 on the first side is paired with the metal pin 9b1 on the second side, the metal pin 9a3 on the first side is paired with the metal pin 9b2 on the second side, and the metal pin 9a4 on the first side is paired with the metal pin 9b3 on the second side.

The lower end faces (corresponding to "first end face" of the present disclosure) of corresponding ones of the metal pins 9a2 to 9a4 and 9b1 to 9b3 in each pair on the first and second sides of the magnetic core 3a are connected to each other by one of the lower wiring electrode patterns 7. At the same time, the upper end face (corresponding to "second end face" of the present disclosure) of each of the metal pins 9a2 to 9a4 on the first side is connected, by one of the upper wiring electrode patterns 6 (corresponding to "connecting portion" of the present disclosure), to the upper end face of a corresponding one of the metal pins 9b2 to 9b4 on the second side, the corresponding one being adjacent on a predetermined side (upper side in the drawing, in the present embodiment) to one of the metal pins 9b1 to 9b3 on the second side, the one being paired with the metal pin on the first side.

More specifically, the lower end faces of the metal pin 9a2 on the first side and the metal pin 9b1 on the second side, which are in a pair, are connected to each other by one of the lower wiring electrode patterns 7, whereas the upper end face of the metal pin 9a2 on the first side and the upper end face of the metal pin 9b2 on the second side are connected to each other by one of the upper wiring electrode patterns 6. The metal pin 9b2 is adjacent, on the upper side in the drawing, to the metal pin 9b1 that is paired with the metal pin 9a2. Similarly, the lower end faces of the metal pin 9b2 on the second side and the metal pin 9a3 on the first side, which are in a pair, are connected to each other by another of the lower wiring electrode patterns 7. The other metal pins are connected in the same manner as above. With this connection configuration, the coil pattern 4a is helically wound around the magnetic core 3a.

Thus, the electronic device 1b including the magnetic core 3a, which is rectangular in plan view, can achieve the same effect as in the electronic device 1a of the first embodiment.

Second Embodiment

Figure 5:
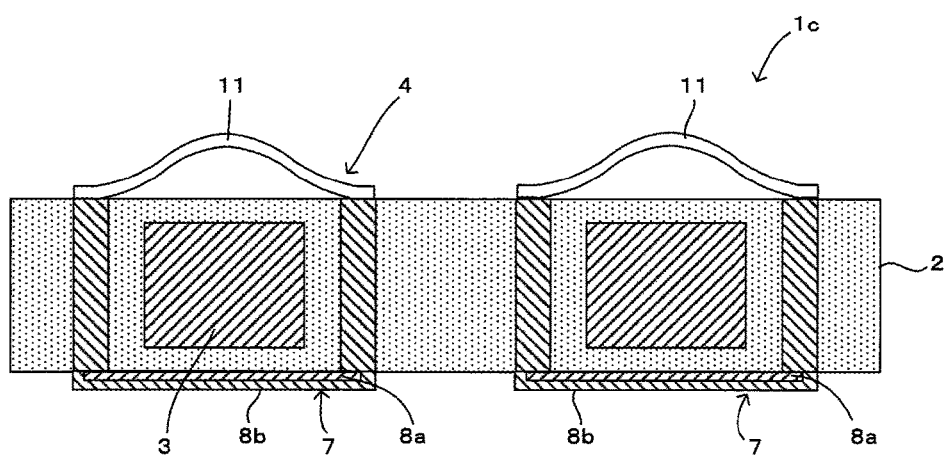
FIG. 5 is a cross-sectional view of an electronic device according to a second embodiment of the present disclosure.

An electronic device 1c according to a second embodiment of the present disclosure will now be described with reference to FIGS. 5 and 6. FIG. 5 is a cross-sectional view of the electronic device 1c, and FIG. 6 is a plan view of the electronic device 1c.

Figure 6:
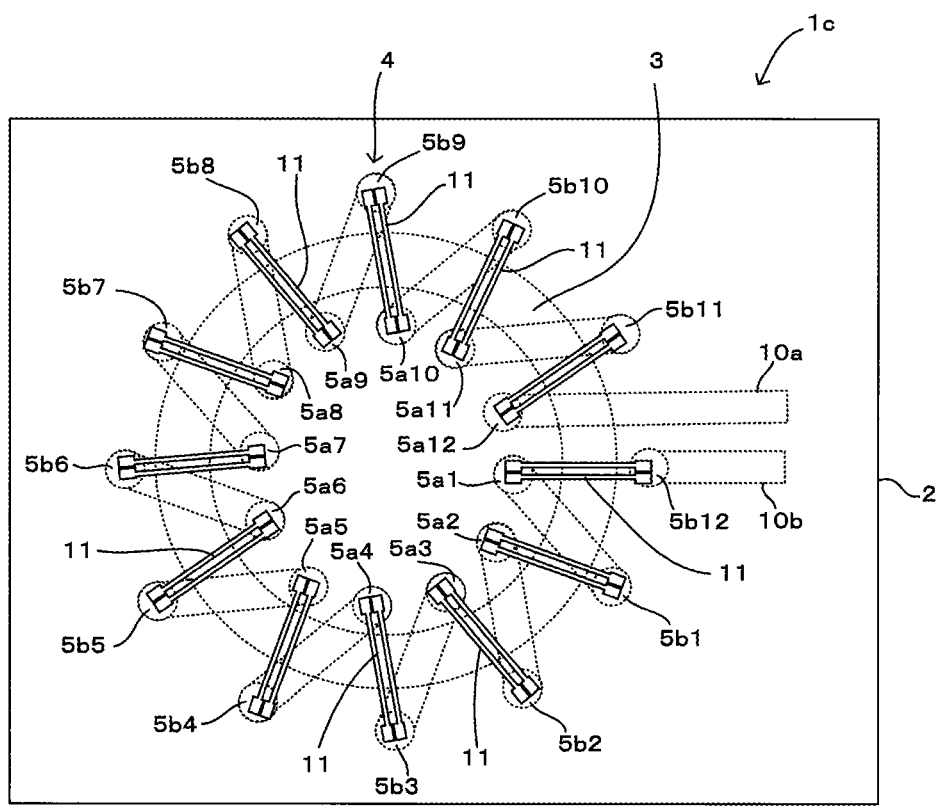
FIG. 6 is a plan view of the electronic device illustrated in FIG. 5.

The electronic device 1c of the present embodiment differs from the electronic device 1a of the first embodiment described with reference to FIGS. 1 to 3 in that the upper end faces of the metal pins 5a1 to 5a12 on the inner side and the upper end faces of the metal pins 5b1 to 5b12 on the outer side corresponding thereto are connected to each other by bonding wires 11 (corresponding to "connecting portion" of the present disclosure), instead of the upper wiring electrode patterns 6, as illustrated in FIGS. 5 and 6. The other configuration is the same as that in the electronic device 1a of the first embodiment, and thus its description will be omitted by assigning the same reference numerals.

In this case, Ni/Au plating is applied to the upper end faces of the metal pins 5a1 to 5a12 and 5b1 to 5b12 for facilitating connection with the bonding wires 11. The bonding wires 11 are formed of metal, such as Au.

The upper end face of each of the metal pins 5a1 to 5a12 on the inner side is connected to the upper end face of the corresponding one of the metal pins 5b1 to 5b12 on the outer side by a plurality of (two in the present embodiment) bonding wires 11. In other words, the upper end face of each of the metal pins 5a1 to 5a12 on the inner side is connected in parallel to the upper end face of the corresponding one of the metal pins 5b1 to 5b12 on the outer side by a plurality of bonding wires 11. Alternatively, the upper end face of each of the metal pins 5a1 to 5a12 on the inner side may be connected by a single bonding wire 11 to the upper end face of the corresponding one of the metal pins 5b1 to 5b12 on the outer side.

Since the loop height of the bonding wires 11 can be changed easily, it is easy to avoid contact between bonding wires 11. Therefore, in the coil pattern 4 with many turns, the bonding wires 11 can be suitably used as connecting portions for connection between predetermined ones of the metal pins 5a1 to 5a12 and 5b1 to 5b12. Since the upper end faces of corresponding ones of the metal pins 5a1 to 5a12 and 5b1 to 5b12 are connected to each other by a plurality of bonding wires, the connection resistance between the upper end faces of the corresponding ones of the metal pins 5a1 to 5a12 and 5b1 to 5b12 can be reduced. Additionally, since changing the loop height of the bonding wires 11 can change the wire length of the connection portions, it is possible to adjust the coil inductance value.

In the configuration where the cross-sectional area of each of the metal pins 5b1 to 5b12 on the outer side is greater than the cross-sectional area of each of the metal pins 5a1 to 5a12 on the inner side, for ease of each connection, the primary side of wire bonding can correspond to the metal pins 5a1 to 5a12 on the inner side. In the connection process of wire bonding, the bonding wires 11 are connected to the metal pins 5a1 to 5a12 and 5b1 to 5b12 with balls at one end portions thereof located on the primary side, and the linear bonding wires 11 are connected to the metal pins 5a1 to 5a12 and 5b1 to 5b12 by being crushed on the secondary side. Therefore, the secondary side requires a larger connection area than the primary side.

In the first and second embodiments, the magnetic core 3 is embedded in the insulating layer 2 by being entirely covered by the insulating layer 2 on the upper and lower surfaces and inner and outer peripheries thereof. Alternatively, the upper or lower surface of the magnetic core 3 may be exposed from the insulating layer 2. In this case, the upper wiring electrode patterns 6 or the lower wiring electrode patterns 7 are formed on the surface of the magnetic core 3. This does not cause significant change in coil characteristics, because the magnetic core 3 is typically formed of an insulating material, such as ferrite. Since this configuration makes it possible to remove part of the insulating layer 2 on the upper or lower side of the magnetic core 3, it is possible to lower the profile of the electronic devices 1a and 1c.

Third Embodiment

Figure 7:
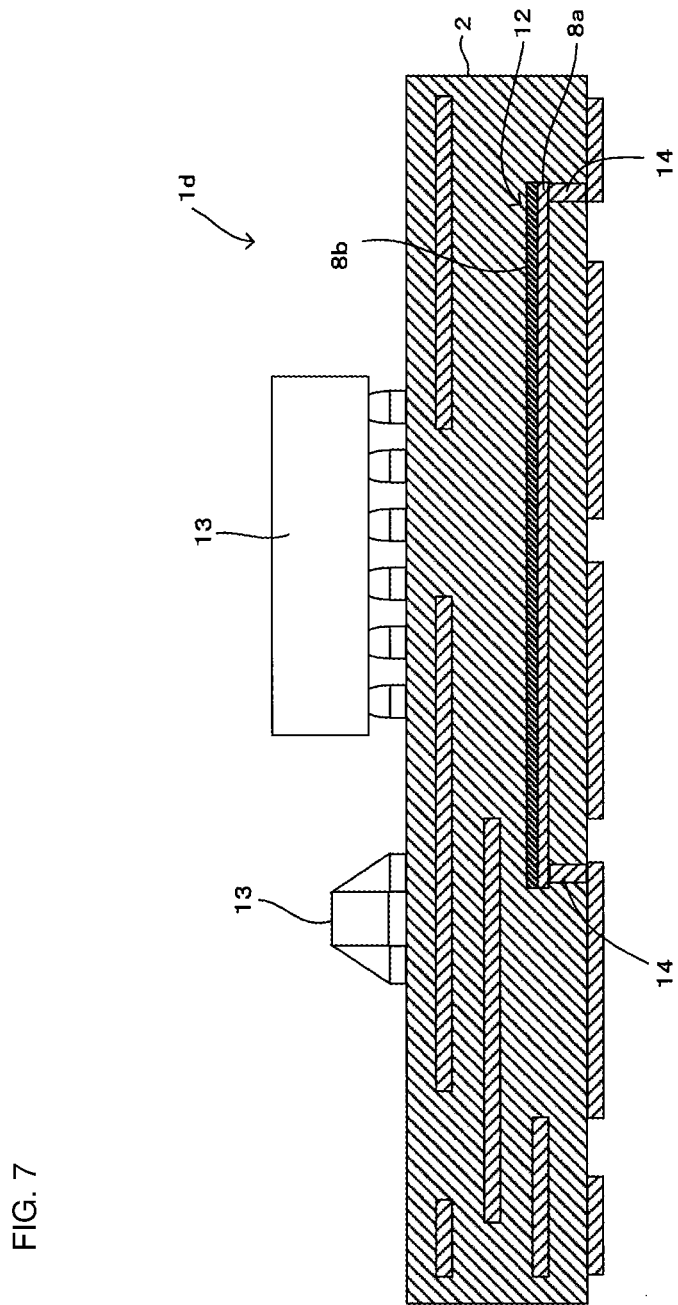
FIG. 7 is a cross-sectional view of an electronic device according to a third embodiment of the present disclosure.

An electronic device 1d according to a third embodiment of the present disclosure will now be described with reference to FIG. 7. FIG. 7 is a cross-sectional view of the electronic device 1d.

As illustrated in FIG. 7, the electronic device 1d of the present embodiment differs from the electronic device 1a of the first embodiment described with reference to FIGS. 1 to 3 in that a wiring electrode pattern 12 is a shielding ground electrode pattern. In FIG. 7, the same components as those in the electronic device 1a of the first embodiment are denoted by the same reference numerals to omit their description.

The electronic device 1d includes the insulating layer 2, components 13 mounted on a principal surface of the insulating layer 2, and the wiring electrode pattern 12 (shielding ground electrode pattern) disposed inside the insulating layer 2 and configured to shield the components 13 from undesired external electromagnetic radiation. The wiring electrode pattern 12 is connected to columnar conductors 14, which may be via conductors or metal pins similar to those in the embodiments described above. The wiring electrode pattern 12 is not linear in shape, and is a so-called solid electrode having a large area.

The wiring electrode pattern 12 includes the underlying electrode layer 8a and the plating electrode layer 8b formed on the underlying electrode layer 8a, as in the embodiments described above. In the present embodiment, the underlying electrode layer 8a is formed to entirely cover the upper end faces of the columnar conductors 14. That is, the upper end faces of the columnar conductors 14 each have no region which is directly connected to the plating electrode layer 8b.

As described above, the wiring electrode pattern 12 including the underlying electrode layer 8a formed of a connecting portion and the plating electrode layer 8b is used as a shielding ground electrode. Thus, as compared to the case where the shielding ground electrode is formed only of a conductive paste, the resistivity of the wiring electrode pattern 12 (shielding ground electrode) can be reduced and the shielding characteristics of the wiring electrode pattern 12 can be improved.

For the connection between the wiring electrode pattern 12 and the columnar conductors 14, as in the first and second embodiments described above, the underlying electrode layer 8a may be formed to cover a part of the upper end face of each of the columnar conductors 14 and the plating electrode layer 8b may be formed to cover the remaining part of the upper end face of the columnar conductor 14 not covered by the underlying electrode layer 8a. In this case, the upper end face of each of the columnar conductors 14 has a region directly connected to the plating electrode layer 8b with low resistivity, and this reduces the connection resistance between the wiring electrode pattern 12 and the columnar conductors 14. Therefore, the shielding characteristics of the wiring electrode pattern 12 can be further improved.

Fourth Embodiment

Figure 8:
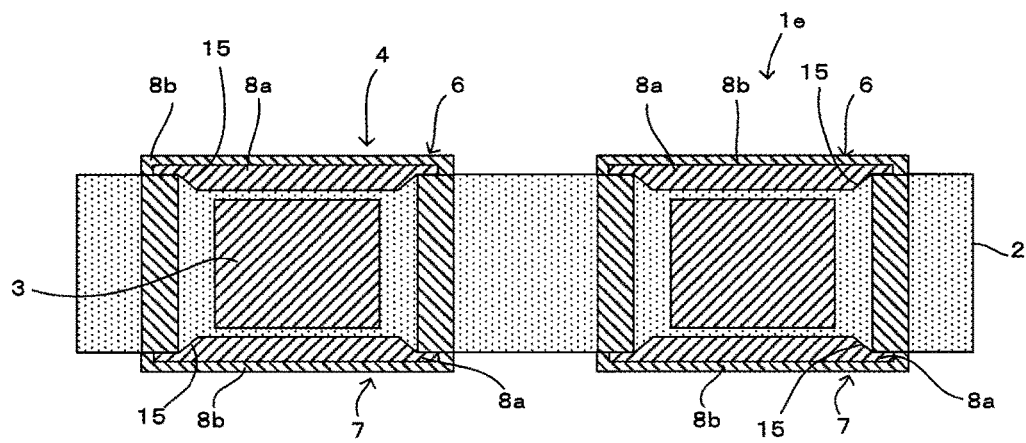
FIG. 8 is a cross-sectional view of an electronic device according to a fourth embodiment of the present disclosure.
Figure 9:
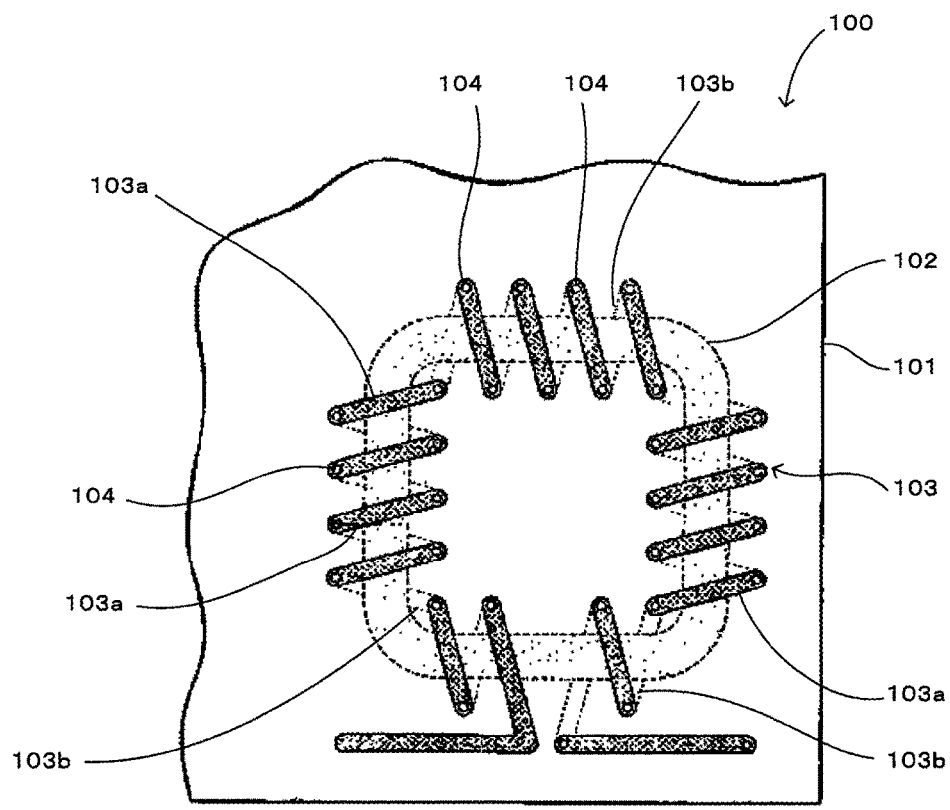
FIG. 9 is a partial plan view of a conventional electronic device.

An electronic device 1e according to a fourth embodiment of the present disclosure will now be described with reference to FIG. 8. FIG. 8 is a cross-sectional view of the electronic device 1e.

As illustrated in FIG. 8, the electronic device 1e of the present embodiment differs from the electronic device 1a of the first embodiment described with reference to FIGS. 1 to 3 in that the upper and lower principal surfaces of the insulating layer 2 have recessed portions 15 in regions where the respective wiring electrode patterns 6 and 7 are formed. The other configuration is the same as that in the electronic device 1a of the first embodiment, and thus its description will be omitted by assigning the same reference numerals.

In this case, the upper and lower principal surfaces of the insulating layer 2 have the recessed portions 15 in regions where the respective wiring electrode patterns 6 and 7 are formed, and the wiring electrode patterns 6 and 7 are formed to fill in the recessed portions 15. The recessed portions 15 are formed, for example, by semi-hardening the insulating layer 2 during its formation and embossing the insulating layer 2 using a resin sheet with a release layer having raised portions, or by using a phenomenon where adjusting the amount of resin during formation of the insulating layer 2 causes the resin to be elevated at each metal pin and depressed between metal pins. Note that when the bonding wires 11, instead of the upper wiring electrode patterns 6, are used as in the second embodiment, the upper principal surface of the insulating layer 2 may not be provided with the recessed portions 15.

With this configuration, it is possible to increase the thickness of the wiring electrode patterns 6 and 7 to further lower the resistivity of the wiring electrode patterns 6 and 7 while maintaining the thickness of the electronic device 1e.

The present disclosure is not limited to the embodiments described above, and various changes other than those described above can be made thereto without departing from the scope thereof. For example, in the electronic device 1a of the first embodiment, an additional insulating layer 2 may be disposed over the upper wiring electrode patterns 6 or under the lower wiring electrode patterns 7. Also, in the electronic device 1c of the second embodiment, each of the bonding wires 11 may be encapsulated with resin, or an additional insulating layer 2 may be disposed under the lower wiring electrode patterns 7.

The metal pins 5a1 to 5a12 and 5b1 to 5b12 are used as columnar conductors in the embodiments described above. Instead of the metal pins 5a1 to 5a12 and 5b1 to 5b12, via conductors or post electrodes may be provided, which can be obtained by filling via holes in the insulating layer 2 with a conductive paste or by via filling plating.

INDUSTRIAL APPLICABILITY

The present disclosure is widely applicable to various electronic devices in which an insulating layer is provided with a wiring electrode pattern, and also to various electronic devices in which the wiring electrode pattern is connected to a columnar conductor.

REFERENCE SIGNS LIST 1a to 1e: electronic device
2: insulating layer
3, 3a: magnetic core (coil core)
4, 4a: coil pattern (coil electrode)
5a1 to 5a12: metal pin on inner side (columnar conductor)
5b1 to 5b12: metal pin on outer side (columnar conductor)
6: upper wiring electrode pattern (wiring electrode pattern)
7: lower wiring electrode pattern (wiring electrode pattern)
8a: underlying electrode layer
8b: plating electrode layer
9a1 to 9a4: metal pin on first side 9b1 to 9b4: metal pin on second side
11: bonding wire
12: wiring electrode pattern
15: recessed portion

The invention claimed is:

1. An electronic device comprising:
an insulating layer;
a wiring electrode pattern on the insulating layer; and
a columnar conductor disposed in the insulating layer and connected at a first end face thereof to the wiring electrode pattern,
wherein the wiring electrode pattern includes an underlying electrode layer comprising a conductive paste and a plating electrode layer on the underlying electrode layer,
wherein the underlying electrode of the wiring electrode pattern covers, with an end portion thereof, a part of the first end face of the columnar conductor, and
wherein a remaining part of the first end face not covered by the underlying electrode layer is covered by the plating electrode layer.

2. The electronic device according to claim 1, wherein the wiring electrode pattern is linear in shape, and a width of the end portion of the underlying electrode layer covering the first end face of the columnar conductor is smaller than a width of the first end face of the columnar conductor.

3. The electronic device according to claim 2, further comprising:
an annular coil core embedded in the insulating layer; and
a coil electrode disposed in and on the insulating layer, the coil electrode being wound around the coil core,
wherein in the coil electrode,
a plurality of metal pins, each serving as the columnar conductor, are arranged side by side on each of inner and outer sides of the coil core such that the plurality of metal pins are in pairs on the inner and outer sides, and the first end faces of metal pins in each pair on the inner and outer sides of the coil core are connected to each other by one of a plurality of wiring electrode patterns; and
a second end face of each of the metal pins on the outer side is connected by a connecting portion to a second end face of a corresponding one of the metal pins on the inner side, the corresponding one being adjacent on a predetermined side to one of the metal pins on the inner side, the one being paired with the metal pin on the outer side.

4. The electronic device according to claim 2, further comprising:
a coil core embedded in the insulating layer; and
a coil electrode disposed in and on the insulating layer, the coil electrode being wound around the coil core,
wherein in the coil electrode,
a plurality of metal pins, each serving as the columnar conductor, are arranged side by side on each of first and second sides of the coil core such that the metal pins are in pairs on the first and second sides, and the first end faces of metal pins in each pair on the first and second sides of the coil core are connected to each other by one of a plurality of wiring electrode patterns; and
a second end face of each of the metal pins on the first side is connected by a connecting portion to a second end face of a corresponding one of the metal pins on the second side, the corresponding one being adjacent on a predetermined side to one of the metal pins on the second side, the one being paired with the metal pin on the first side.

5. The electronic device according to claim 1, wherein the wiring electrode pattern is on a principal surface of the insulating layer;
the insulating layer has a recessed portion provided in a region of the principal surface where the wiring electrode pattern is provided; and
the wiring electrode pattern is provided to fill in the recessed portion.

6. The electronic device according to claim 3, wherein a cross-sectional area of each of the metal pins on the outer side is greater than a cross-sectional area of each of the metal pins on the inner side.

7. The electronic device according to claim 3, wherein a bonding wire serves as the connecting portion.

8. The electronic device according to claim 7, wherein a plurality of bonding wires serve as the connecting portion.

9. The electronic device according to claim 1, wherein the wiring electrode pattern is a shielding ground electrode pattern.

10. The electronic device according to claim 1, wherein the insulating layer comprises resin.

11. The electronic device according to claim 1, wherein the wiring electrode pattern is on a principal surface of the insulating layer;
the insulating layer has a recessed portion provided in a region of the principal surface where the wiring electrode pattern is provided; and
the wiring electrode pattern is provided to fill in the recessed portion.

12. The electronic device according to claim 2, wherein the wiring electrode pattern is on a principal surface of the insulating layer;
the insulating layer has a recessed portion provided in a region of the principal surface where the wiring electrode pattern is provided; and
the wiring electrode pattern is provided to fill in the recessed portion.

13. The electronic device according to claim 3, wherein the wiring electrode pattern is on a principal surface of the insulating layer;
the insulating layer has a recessed portion provided in a region of the principal surface where the wiring electrode pattern is provided; and
the wiring electrode pattern is provided to fill in the recessed portion.

14. The electronic device according to claim 4, wherein the wiring electrode pattern is on a principal surface of the insulating layer;
the insulating layer has a recessed portion provided in a region of the principal surface where the wiring electrode pattern is provided; and
the wiring electrode pattern is provided to fill in the recessed portion.

15. The electronic device according to claim 4, wherein a bonding wire serves as the connecting portion.

16. The electronic device according to claim 5, wherein a bonding wire serves as the connecting portion.

17. The electronic device according to claim 6, wherein a bonding wire serves as the connecting portion.

18. The electronic device according to claim 1, wherein the wiring electrode pattern is a shielding ground electrode pattern.

19. The electronic device according to claim 1, wherein the insulating layer comprises resin.

* * * * *